(12) United States Patent
Hibino

(10) Patent No.: US 10,257,954 B2
(45) Date of Patent: Apr. 9, 2019

(54) ELECTRONIC DEVICE

(71) Applicant: KYOCERA CORPORATION, Kyoto (JP)

(72) Inventor: Kouta Hibino, Suita (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/747,724

(22) PCT Filed: Mar. 8, 2016

(86) PCT No.: PCT/JP2016/057116
§ 371 (c)(1),
(2) Date: Jan. 25, 2018

(87) PCT Pub. No.: WO2017/017979
PCT Pub. Date: Feb. 2, 2017

(65) Prior Publication Data
US 2018/0220543 A1      Aug. 2, 2018

(30) Foreign Application Priority Data

Jul. 28, 2015   (JP) .................................. 2015-148842

(51) Int. Cl.
*H05K 7/14*       (2006.01)
*G06F 1/26*       (2006.01)
(Continued)

(52) U.S. Cl.
CPC ................. *H05K 7/14* (2013.01); *G06F 1/26* (2013.01); *H01M 2/10* (2013.01); *H04M 1/02* (2013.01);
(Continued)

(58) Field of Classification Search
CPC ...... H05K 7/14; H05K 5/0086; H05K 5/0217; H05K 5/0004; H01M 2/04; H01M 2/1066;
(Continued)

(56) References Cited

U.S. PATENT DOCUMENTS

| 2004/0048638 A1* | 3/2004 | Inomata ............. H01M 2/1022 455/572 |
| 2006/0019530 A1* | 1/2006 | Chun .................. H01M 2/1066 439/500 |

(Continued)

FOREIGN PATENT DOCUMENTS

| JP | 2000286937 A | 10/2000 |
| JP | 2014002935 A | 1/2014 |

(Continued)

OTHER PUBLICATIONS

International Search Report/Written Opinion dated Apr. 26, 2016, in corresponding International Application No. PCT/JP2016/057116 with Statement of Relevance of Non-English References.

(Continued)

*Primary Examiner* — Steven T Sawyer
*Assistant Examiner* — Sagar Shrestha
(74) *Attorney, Agent, or Firm* — Duane Morris LLP

(57) ABSTRACT

An electronic device includes a battery including a first end portion in a plan view, the first end portion including a first engagement portion, a first case member including an accommodation portion where the battery is accommodated, and a slide member which is held by the first case member and is slidable along the first end portion. The slide member includes a first structure which prevents the slide member from dropping off from the first case member. The slide member can take a first position at which the slide member is in engagement with the first engagement portion and a (Continued)

second position at which the slide member is not in engagement with the first engagement portion as a result of sliding along the first end portion.

6 Claims, 13 Drawing Sheets

(51) Int. Cl.
*H01M 2/10* (2006.01)
*H04M 1/02* (2006.01)
*H05K 5/00* (2006.01)
*H05K 5/02* (2006.01)
*H04B 1/3883* (2015.01)

(52) U.S. Cl.
CPC ......... *H05K 5/0004* (2013.01); *H05K 5/0086* (2013.01); *H05K 5/0217* (2013.01); *H04B 1/3883* (2013.01)

(58) Field of Classification Search
CPC ............ H01M 2220/30; H04B 1/3883; H04M 1/0262
See application file for complete search history.

(56) References Cited

U.S. PATENT DOCUMENTS

| | | | |
|---|---|---|---|
| 2006/0079298 A1* | 4/2006 | Saitoh | H01M 2/1066 455/575.1 |
| 2011/0183174 A1* | 7/2011 | Ouyang | H01M 2/1066 429/97 |
| 2013/0209866 A1 | 8/2013 | Watanabe | |
| 2015/0326967 A1 | 11/2015 | Otani | |
| 2016/0306389 A1* | 10/2016 | Urimoto | G06F 1/1656 |

FOREIGN PATENT DOCUMENTS

WO 2012/057238 A1 5/2012
WO 2013/094391 A1 6/2013

OTHER PUBLICATIONS

Official Action issued in corresponding Japanese Patent Application No. 2015-148842 with Concise Explanation of Office Action.

* cited by examiner

ELECTRONIC DEVICE

CROSS-REFERENCE TO RELATED APPLICATION

The present application is the National Phase of PCT International Application No. PCT/JP2016/057116, filed on Mar. 8, 2016, which claims priority under 35 U.S.C. 119 (a) to Japanese Patent Application No. 2015-148842, filed on Jul. 28, 2015. PCT International Application No. PCT/JP2016/057116 and Japanese Patent Application No. 2015-148842 are entitled "Electronic Device". The content of which are incorporated by reference herein in their entirety.

FIELD

An embodiment of the present disclosure relates to an electronic device.

BACKGROUND

An information communication terminal device including a battery lid has been known.

An electronic device including a cover panel in a front surface has been known.

SUMMARY

An electronic device based on the present disclosure includes a battery including a first end portion in a plan view, the first end portion including a first engagement portion, a first case member including an accommodation portion where the battery is accommodated, and a slide member which is held by the first case member and is slidable along the first end portion. The slide member includes a first structure which prevents the slide member from dropping off from the first case member. The slide member can take a first position at which the slide member is in engagement with the first engagement portion and a second position at which the slide member is not in engagement with the first engagement portion as a result of sliding along the first end portion.

DETAILED DESCRIPTION

The present disclosure desirably provides an electronic device out of which a battery can be less likely to come.

First Embodiment

Figure 1:
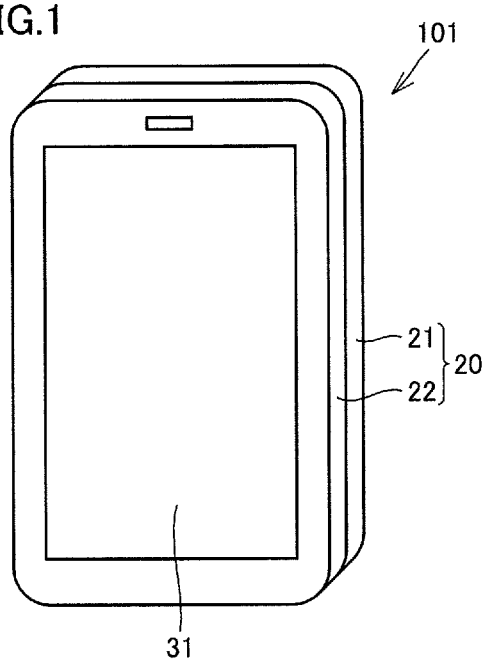
FIG. 1 is a perspective view in which a front surface of an electronic device is seen in a first embodiment based on the present disclosure.

An electronic device in a first embodiment based on the present disclosure will be described with reference to FIGS. 1 to 15. FIG. 1 shows an appearance of an electronic device 101 in the first embodiment.

Electronic device 101 includes a display area 31 on a front surface side. Electronic device 101 includes a case 20. Case 20 includes a first case member 21 and a second case member 22. In an example shown here, first case member 21 is a member which covers a rear surface (rear) side and second case member 22 is a member which covers a front surface (front) side.

Figure 2:
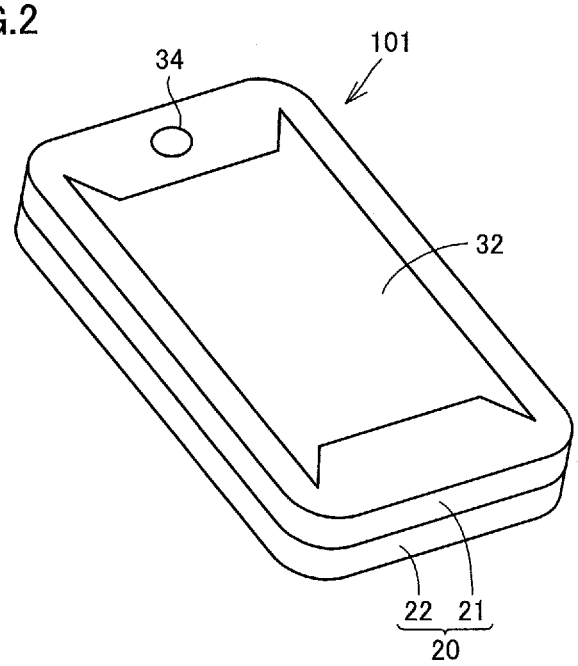
FIG. 2 is a perspective view in which a rear surface of the electronic device is seen in the first embodiment based on the present disclosure.

FIG. 2 shows a perspective view in which electronic device 101 is positioned with the rear surface side thereof being mainly seen. For example, an image pick-up portion 34 may be located at one end portion on the rear surface side. A lid portion 32 is combined with first case member 21. Lid portion 32 is a lid for covering a battery accommodated in electronic device 101. Lid portion 32 may cover also a mechanism for attaching and removing a storage medium in addition to a battery. An outer shape of lid portion 32 shown here is merely by way of example and the outer shape is not limited as such.

Figure 3:
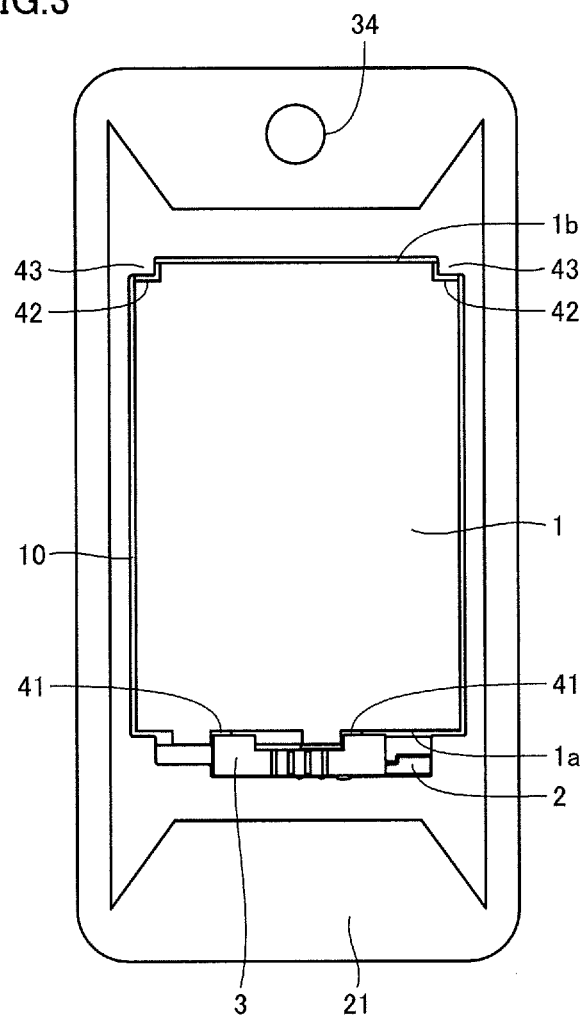
FIG. 3 is a plan view of the electronic device with a lid portion thereof having been removed in the first embodiment based on the present disclosure.

FIG. 3 shows a plan view with lid portion 32 having been removed. A battery 1 is accommodated in an accommodation portion 10. Accommodation portion 10 is a recess in first case member 21. Battery 1 is substantially rectangular in such a plan view and includes a first end portion 1a and a second end portion 1b as short sides in parallel to each other. A slide track 2 is located in first case member 21. Slide track 2 extends along first side 1a of battery 1a. A slide member 3 is held as being slidable in slide track 2.

Figure 4:
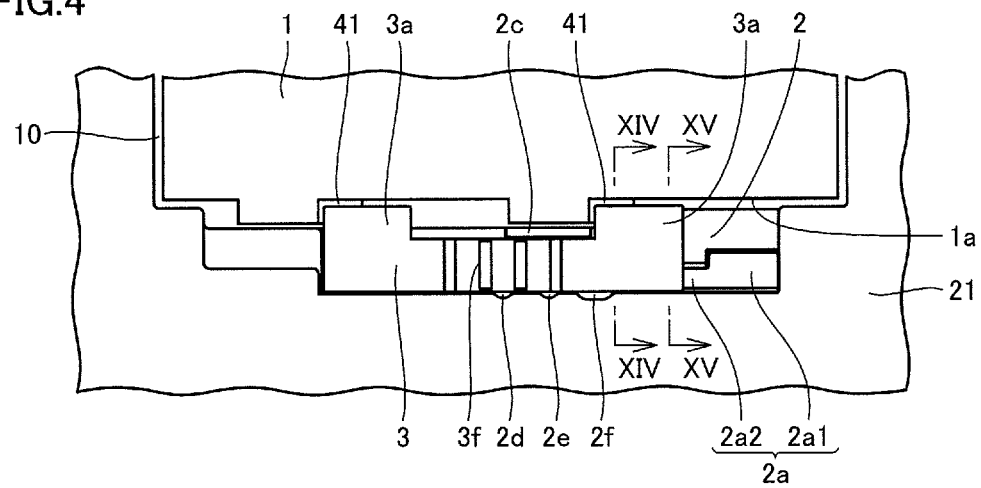
FIG. 4 is a plan view of the vicinity of a slide member in FIG. 3 as being enlarged, with the slide member being located at a first position.

FIG. 4 shows the vicinity of slide member 3 in FIG. 3 as being enlarged. In FIG. 4, an extension portion 3a of slide member 3 is engaged with a first engagement portion 41 of battery 1 with the extension portion extending over the first engagement portion. Electronic device 101 can be in a state in FIG. 5 as a user displaces slide member 3.

Figure 5:
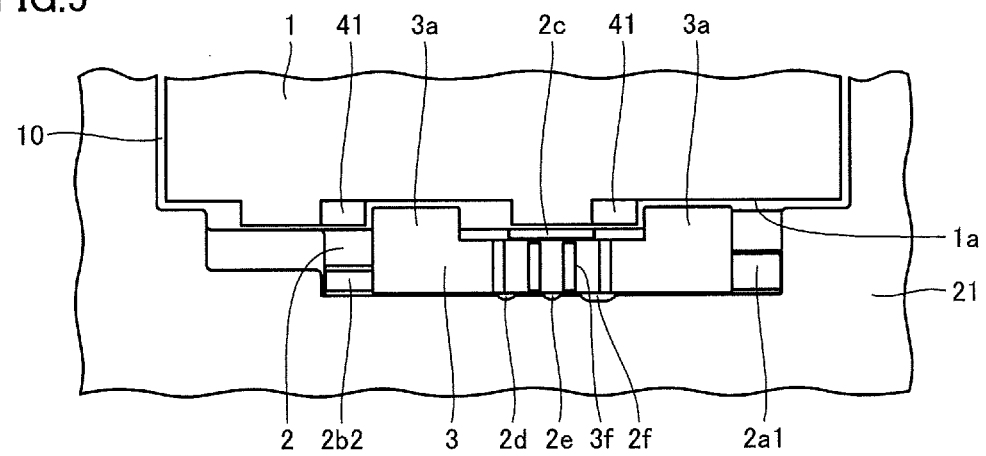
FIG. 5 is a plan view showing the slide member located at a second position.

Electronic device 101 in the first embodiment includes battery 1, first case member 21, and slide member 3. Battery 1 includes first end portion 1a in the plan view. First engagement portion 41 is located at first end portion 1a of battery 1. First case member 21 includes accommodation portion 10 where battery 1 is accommodated. First case member 21 includes slide track 2 at a position where the slide track is located along first end portion 1a when battery 1 is accommodated in accommodation portion 10. Slide member 3 is held by the first case member and slidable along first end portion 1a. Specifically, slide member 3 is located in slide track 2 and slidable along first end portion 1a. Slide member 3 includes a first structure which prevents the slide member from dropping off from the first case member. Details of the first structure will be described later. Slide member 3 can take a first position where slide member 3 is in engagement with first engagement portion 41 and a second position where slide member 3 is not in engagement with first engagement portion 41 as a result of sliding along first end portion 1a. In FIG. 4, slide member 3 is located at the first position. This state corresponds to a state that battery 1 is locked. In FIG. 5, slide member 3 is located at the second position. This state corresponds to a state that battery 1 has been unlocked.

Figure 6:
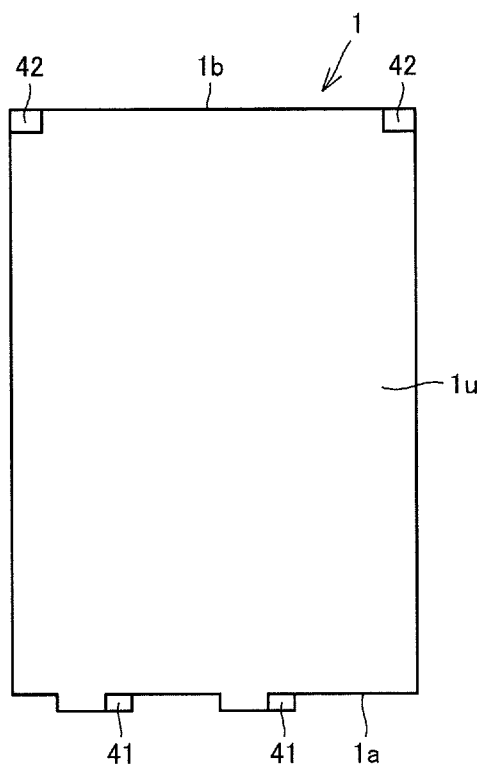
FIG. 6 is a plan view of a battery included in the electronic device in the first embodiment based on the present disclosure.
Figure 7:
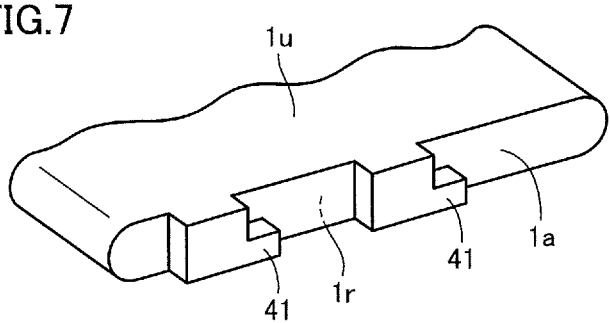
FIG. 7 is a perspective view of the vicinity of a first end portion of the battery included in the electronic device in the first embodiment based on the present disclosure.
Figure 8:
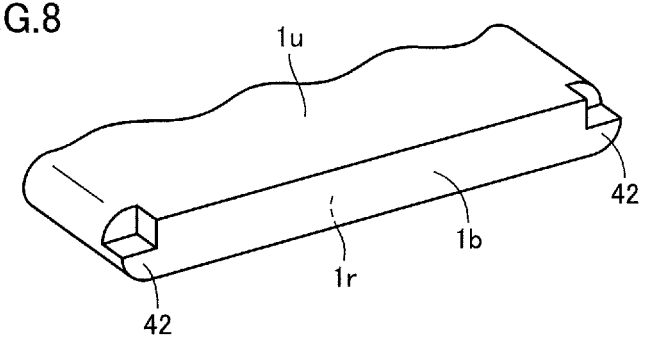
FIG. 8 is a perspective view of the vicinity of a second end portion of the battery included in the electronic device in the first embodiment based on the present disclosure.

FIG. 6 shows battery 1 taken out alone. FIG. 6 shows a plan view of battery 1. Battery 1 is in a form of a plate and includes a first main surface 1u. First main surface 1u faces an exit side of accommodation portion 10. First main surface 1u faces the rear surface side of electronic device 101. FIG. 7 shows a perspective view of the vicinity of first end portion 1a of battery 1. Battery 1 includes a second main surface 1r as a surface opposite to first main surface 1u. First end portion 1a includes two first engagement portions 41. First engagement portion 41 is formed, for example, as a protrusion in an L shape. FIG. 8 shows a perspective view of the vicinity of second end portion 1b of battery 1. Second end portion 1b includes two second engagement portions 42. Second engagement portion 42 is formed, for example, as a cut in a corner portion of battery 1.

Figure 9:
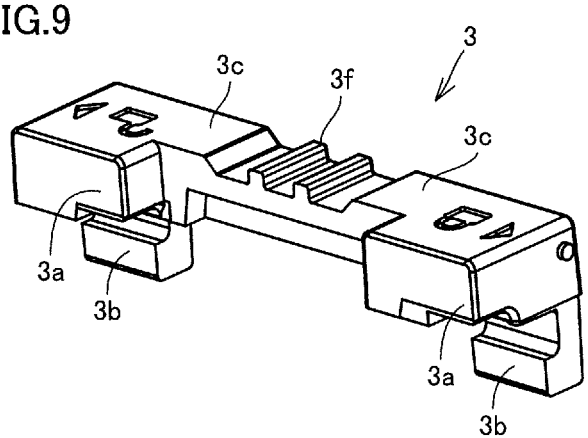
FIG. 9 is a first perspective view of the slide member included in the electronic device in the first embodiment based on the present disclosure.
Figure 10:
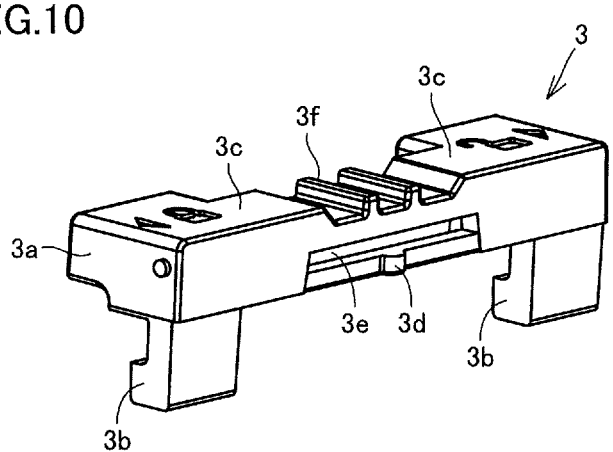
FIG. 10 is a second perspective view of the slide member included in the electronic device in the first embodiment based on the present disclosure.
Figure 11:
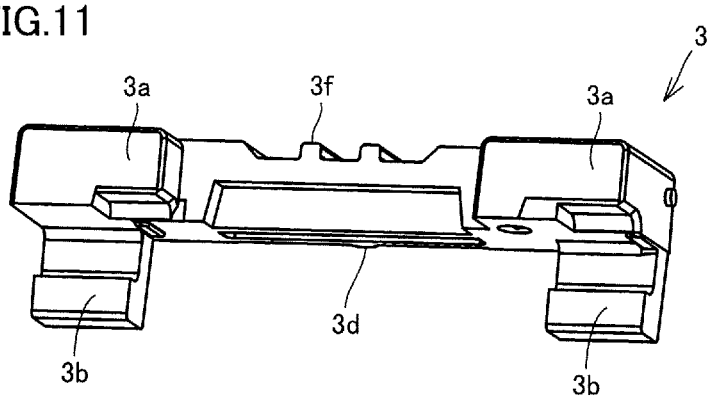
FIG. 11 is a third perspective view of the slide member included in the electronic device in the first embodiment based on the present disclosure.

FIG. 9 shows slide member 3 taken out alone. FIGS. 10 and 11 show slide member 3 from further different directions.

Figure 12:
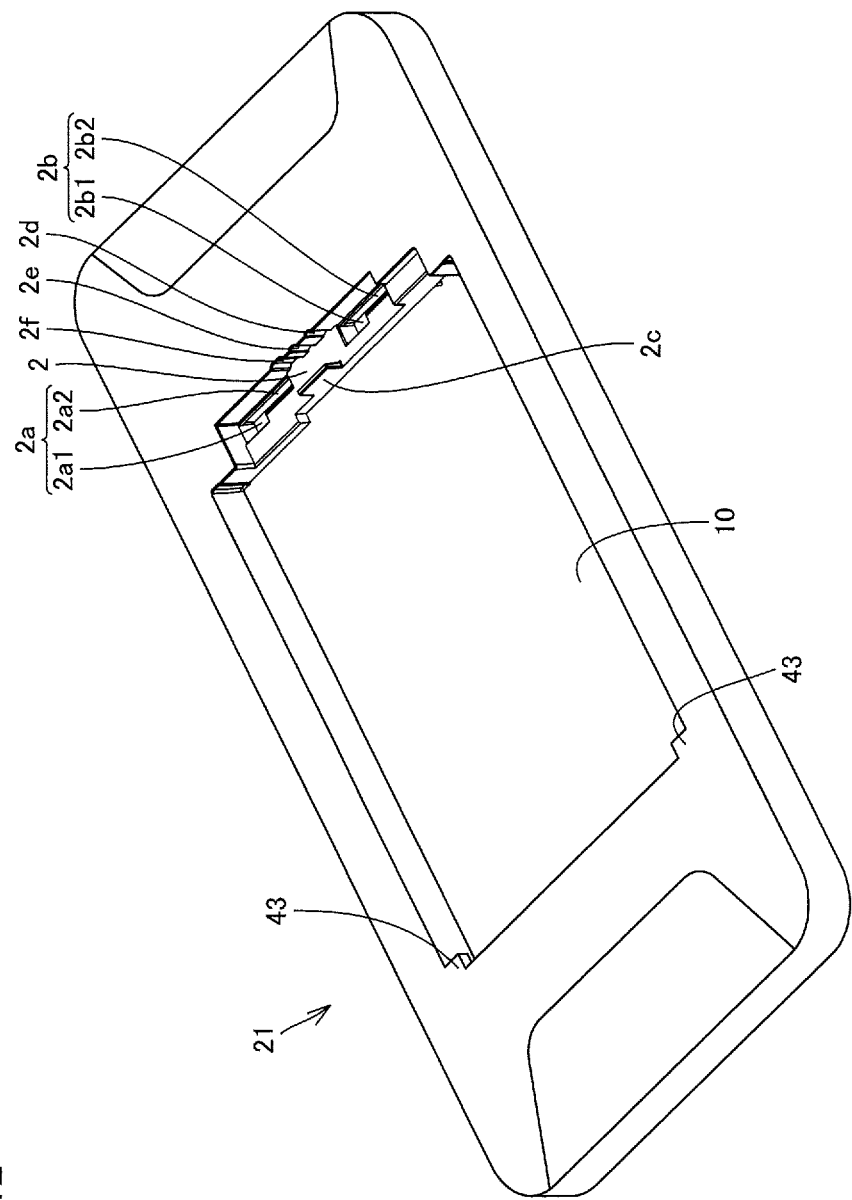
FIG. 12 is a perspective view of a first case member included in the electronic device in the first embodiment based on the present disclosure.
Figure 13:
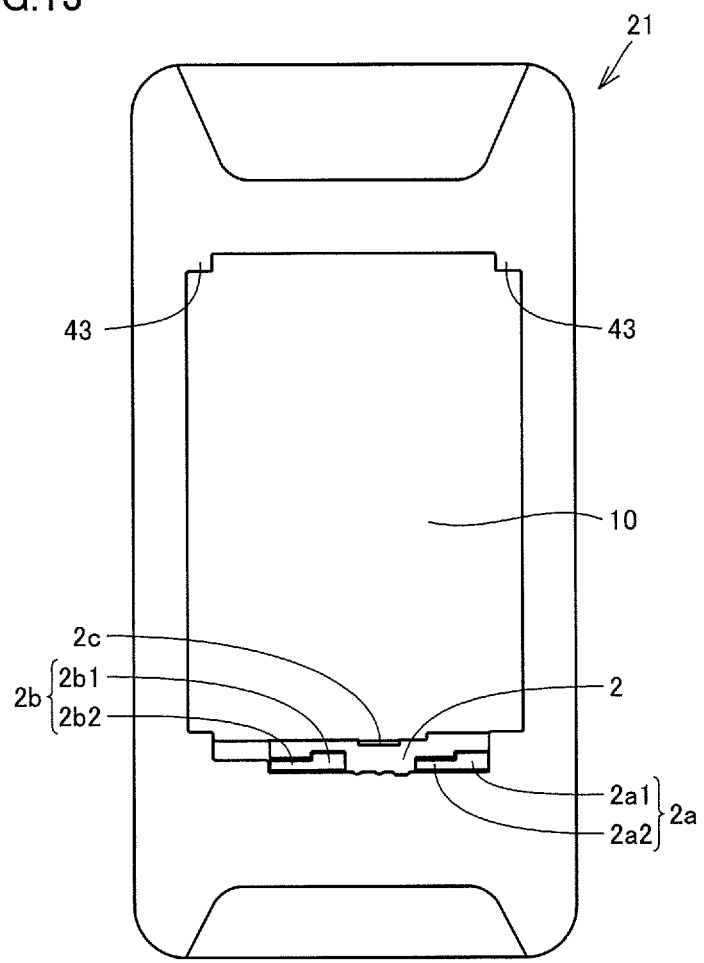
FIG. 13 is a plan view of the first case member included in the electronic device in the first embodiment based on the present disclosure.

FIG. 12 shows first case member 21 taken out alone. FIG. 13 shows a plan view of first case member 21. First case member 21 includes slide track 2 along one end portion of accommodation portion 10. Slide track 2 is located to accept slide member 3. A bottom surface of slide track 2 includes two openings 2a and 2b. Openings 2a and 2b are both through holes in an L shape. Opening 2a includes such an opening that a large-width portion 2a1 and a small-width portion 2a2 are connected to each other. Opening 2b includes such an opening that a large-width portion 2b1 and a small-width portion 2b2 are connected to each other. As shown in FIGS. 12 and 13, a partition 2c may be located along a partial section of slide track 2. Partition 2c is a projection in a form of a wall erected as a part of first case member 21. Partition 2c separates slide track 2 and accommodation portion 10 from each other.

Figure 14:
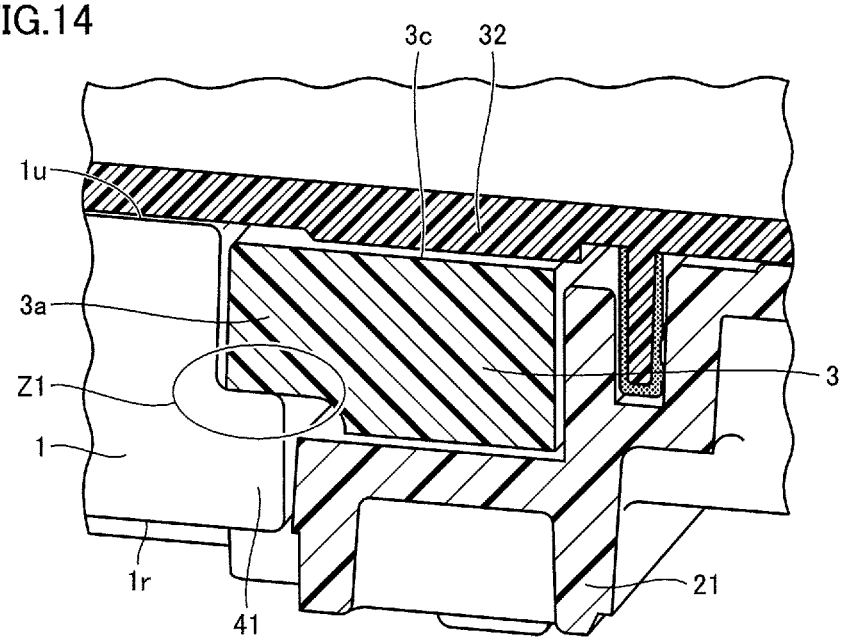
FIG. 14 is a cross-sectional view along the line XIV-XIV in FIG. 4.
Figure 15:
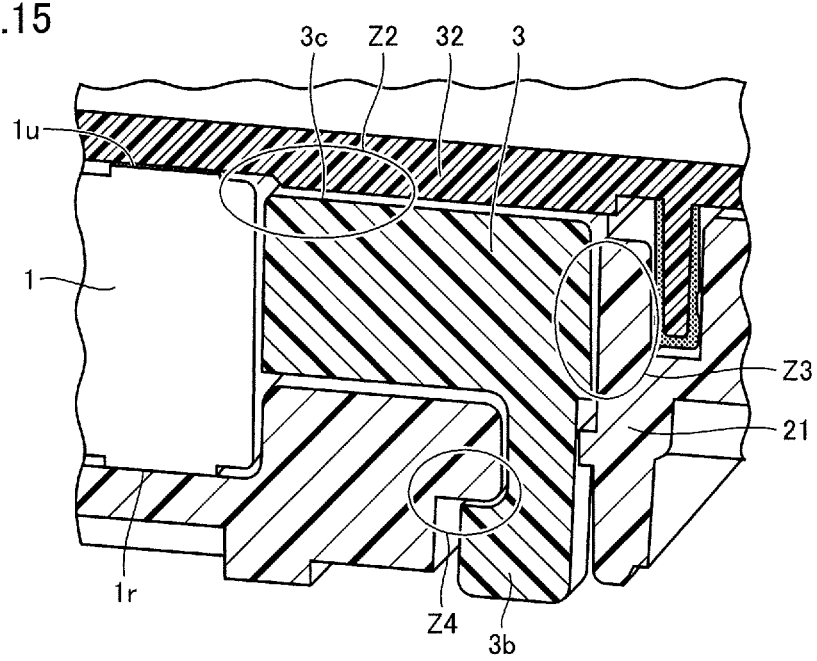
FIG. 15 is a cross-sectional view along the line XV-XV in FIG. 4.

FIG. 14 shows a cross-sectional view along the line XIV-XIV in FIG. 4, which shows slide member 3 located at the first position. FIG. 15 shows a cross-sectional view along the line XV-XV in FIG. 4.

In the first embodiment, slide member 3 which slides along first end portion 1a of battery 1 is located, and switching between a state that battery 1 is restrained so as not to come out of accommodation portion 10 and a state that the battery is not so restrained can be made based on whether slide member 3 is set at the first position or the second position. Therefore, setting slide member 3 at the first position in electronic device 101 in the first embodiment readily makes it difficult for battery 1 to come out of electronic device 101.

When slide member 3 is located at the first position, slide member 3 is in engagement with first engagement portion 41. Various manners of engagement are possible. For example, as shown in the first embodiment, slide member 3 may include extension portion 3a which restrains first engagement portion 41 so as to prevent battery 1 from coming out of accommodation portion 10 when slide member 3 is located at the first position. In FIG. 4, two extension portions 3a located in slide member 3 restrain first engagement portion 41. Such restraint is more clearly shown in a Z1 portion in FIG. 14. By adopting such a construction, slide member 3 can be engaged with first engagement portion 41 with a simple structure and battery 1 can be prevented from coming out of accommodation portion 10.

Though battery 1 includes two first engagement portions 41 in the first embodiment, the number of first engagement portions 41 is not limited to two and the number may be set to one or three or more. Most realistically, from a point of view of a space and stability, two locations are considered as optimal. The number of extension portions 3a located in slide member 3 is set in correspondence with the number of first engagement portions 41. Therefore, the number of extension portions 3a is not limited to two either and the number may be one or three or more.

As shown in FIGS. 9 to 11 and 15, the first structure which prevents slide member 3 from dropping off may include a hook portion 3b hooked to first case member 21. In other words, slide member 3 may include hook portion 3b hooked to first case member 21 so as not to drop off from slide track 2 when slide member 3 is located at the first position and the second position. In the first embodiment, two hook portions 3b are located in one slide member 3. The number of hook portions 3b is not limited to two and the number may be set to one or three or more. Most realistically, from a point of view of a space and stability, the number of hook portions 3b of two is considered as optimal.

Though hook portion 3b is exemplified as the first structure of slide member 3, the first structure is not limited thereto. Though a tip end of hook portion 3b protrudes toward the left in FIG. 9, such a structure that the tip end protrudes toward the right instead of the left in the figure is also applicable. Though hook portion 3b shown in FIGS. 9 to 11 has a cross-section in the L shape, the first structure of slide member 3 may include a structure having a cross-section, for example, in a T shape. The first structure of slide member 3 should only be such a structure as being inserted in some orientation into first case member 21 and hooked with some method against force in a direction away from first case member 21. The first structure, however, should allow sliding of slide member 3.

Figure 16:
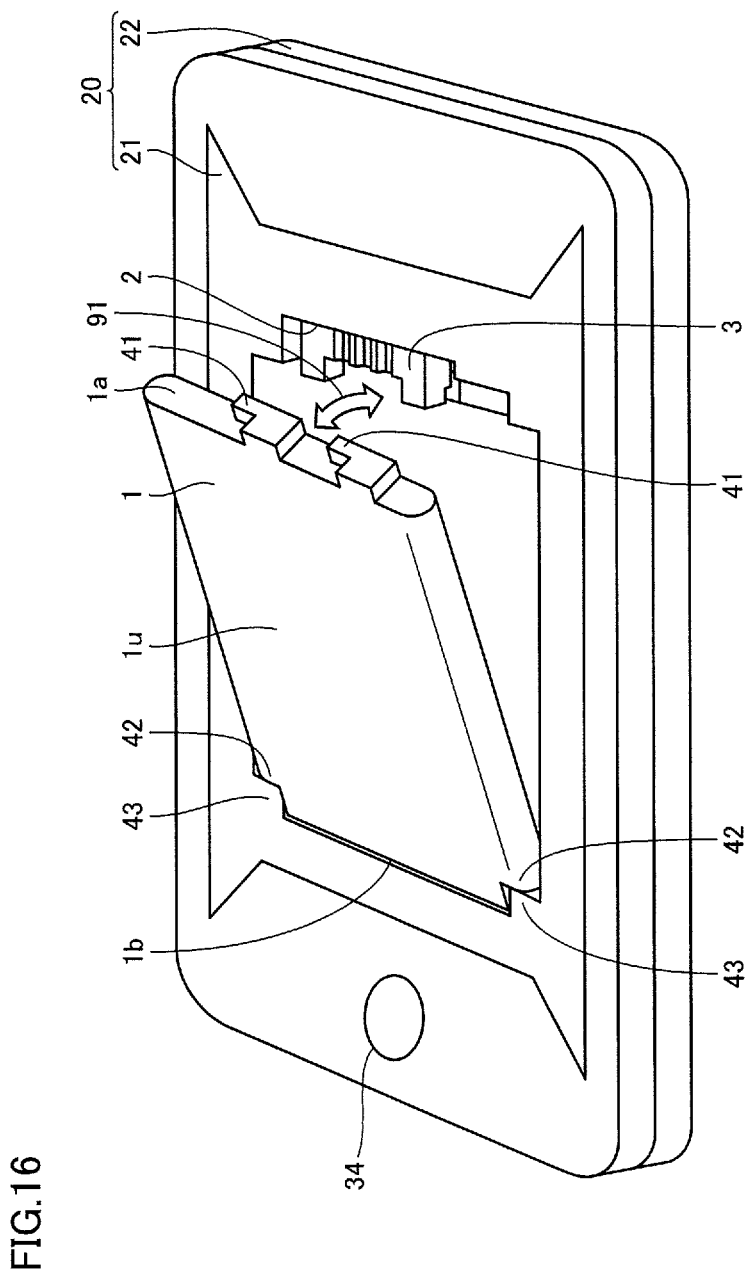
FIG. 16 is an illustrative diagram of introduction and removal of a battery in and from an accommodation portion by pivoting the battery in the electronic device in the first embodiment based on the present disclosure.

As shown in the first embodiment, battery 1 includes second end portion 1b opposite to first end portion 1a. Second end portion 1b includes second engagement portion 42. First case member 21 includes a third engagement portion 43 which is engaged with second engagement portion 42. While slide member 3 is located at the second position, battery 1 may be introducible in and removable from accommodation portion 10 as being pivoted around a portion where second engagement portion 42 and third engagement portion 43 are in contact with each other. As shown in FIG. 16, battery 1 may be introducible in and removable from accommodation portion 10 by being pivoted along an arrow 91. By thus including third engagement portion 43 in first case member 21 such that third engagement portion 43 is engaged with second engagement portion 42 at second end portion 1b of battery 1, in introducing battery 1 in accommodation portion 10, second end portion 1b is first inserted in accommodation portion 10 and then battery 1 is pivoted along arrow 91 to introduce first end portion 1a in accommodation portion 10. In contrast, in taking out battery 1 from accommodation portion 10, with slide member 3 being set at the second position, battery 1 is pivoted along arrow 91 for first taking out first end portion 1a from accommodation portion 10 and thereafter taking second end portion 1b out of accommodation portion 10. Since second engagement portion 42 of battery 1 and third engagement portion 43 of first case member 21 are in engagement with each other, in taking out battery 1 correctly introduced in accommodation portion 10, second end portion 1b cannot be taken out first. Since a procedure for introducing and taking out battery 1 is restricted, battery 1 can be prevented as much as possible from coming out of accommodation portion 10 due to an impact at undesired timing.

Figure 17:
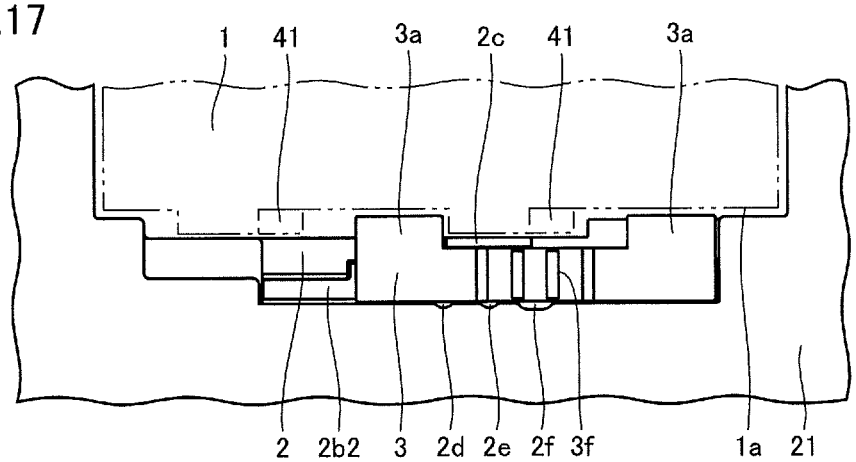
FIG. 17 is a plan view showing the slide member located at a third position.

Slide member 3 may be constructed to be able to take a third position which is different from the first position (see FIG. 4) and the second position (see FIG. 5) where slide member 3 is attachable to and removable from first case member 21 as a result of sliding along first end portion 1a. Such sliding is performed within slide track 2. At the third position, slide member 3 is freely inserted in and removed from slide track 2. FIG. 17 shows slide member 3 located at the third position. Since FIG. 17 shows a state with battery 1 having been removed, battery 1 is shown with a chain double dotted line. In attaching slide member 3 to slide track 2 at a site of assembly of electronic device 101, slide member 3 is inserted when it is located at the third position as shown in FIG. 17. Since two hook portions 3b of slide member 3 can pass through large-width portions 2a1 and 2b1 of respective openings 2a and 2b in this state, slide member 3 can readily be inserted and removed. By thereafter displacing slide member 3 to the second position (see FIG. 5), two hook portions 3b enter small-width portions 2a2 and 2b2 of respective openings 2a and 2b and therefore hook portion 3b does not come off. Slide member 3 does not drop off from slide track 2. Since two hook portions 3b still stay in small-width portions 2a2 and 2b2 of respective openings 2a and 2b even when slide member 3 is displaced to the first position (see FIG. 4), hook portions 3b do not come off. Therefore, slide member 3 is prevented from dropping off from slide track 2 when it is located at the first position or the second position. Normally, slide member 3 is set at the third position only immediately after slide member 3 is assembled in first case member 21, and it does not have to be moved to the third position so long as a user normally uses electronic device 101. When electronic device 101 should be disassembled for some reason, however, slide member 3 can readily be detached from first case member 21 by moving slide member 3 to the third position.

As shown in FIGS. 9 to 11, slide member 3 includes a protrusion 3d in a side surface which faces a direction opposite to battery 1 in the first embodiment. A groove 3e is located in the vicinity of protrusion 3d.

As shown in FIGS. 4, 5, and 12, three grooves, that is, grooves 2d, 2e, and 2f, are located in first case member 21. Since slide member 3 includes protrusion 3d (see FIGS. 9 to 11), as a result of sliding of slide member 3 within slide track 2, protrusion 3d is stabilized as being fitted into any of grooves 2d and 2e. Groove 2d is used when slide member 3 is located at the first position (see FIG. 4) and groove 2e is used when slide member 3 is located at the second position (see FIG. 5). As protrusion 3d is thus fitted in any of grooves 2d and 2e, a user can obtain a click feeling. Since groove 3e is provided adjacently to protrusion 3d in slide member 3 shown in the first embodiment, a root of protrusion 3d tends to deform and consequently sliding of slide member 3 from a state that protrusion 3d is fitted in any of grooves 2d and 2e can be facilitated.

Groove 2f is located in first case member 21 separately from grooves 2d and 2e as shown in FIGS. 4, 5, and 12, and groove 2f is used when slide member 3 is located at the third position (see FIG. 17). When slide member 3 is located at the third position, protrusion 3d enters groove 2f. Groove 2f is thus located so that slide member 3 at the third position is stabilized.

In the example shown in the first embodiment, slide member 3 includes a protrusion 3f on a surface seen from a user. Though two linear protrusions 3f are located in this example, the number of protrusions 3f is not limited to two. Protrusion 3f is not limited to a linear protrusion either. Protrusion 3f is located to facilitate catching of slide member 3 by a fingertip or a tip of a nail of a user. With such protrusion 3f, an operation by a user to move slide member 3 is facilitated.

Figure 18:
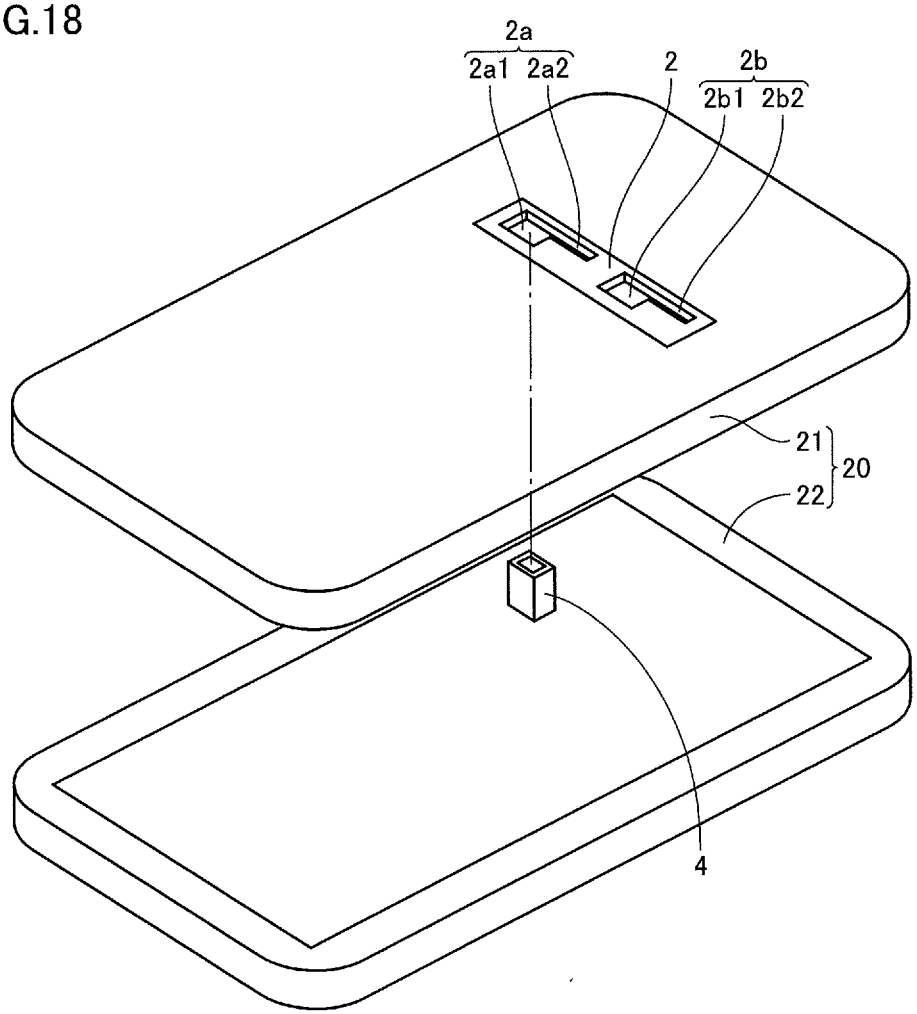
FIG. 18 is an illustrative diagram of attachment of a second case member to the first case member.
Figure 19:
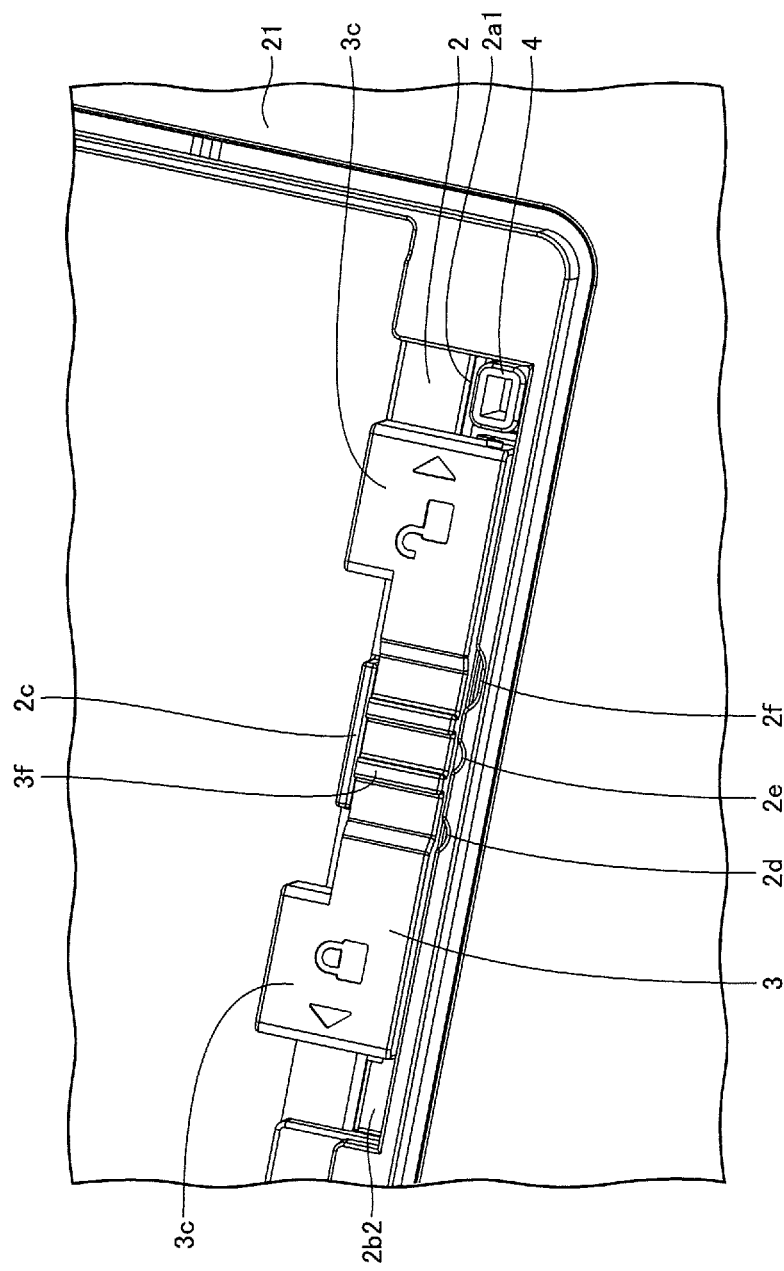
FIG. 19 is an enlarged view of the vicinity of the slide member with the second case member being attached to the first case member.

As shown in FIG. 18, the construction may be such that second case member 22 is attached to first case member 21, second case member 22 includes a first protrusion 4 inserted in a space in which slide member 3 slides, that is, slide track 2, while second case member 22 is attached to first case member 21, and slide member 3 is prevented from taking the third position while first protrusion 4 is located in the space. FIG. 18 shows first protrusion 4 located in second case member 22. First protrusion 4 is located at a position where it is inserted in large-width portion 2a1 of opening 2a when second case member 22 is attached to first case member 21. First protrusion 4 may be in a simple columnar shape. In the example shown in FIG. 18, the first protrusion is in a form of a substantially quadrangular hollow prism. With such a hollow shape, reduction in weight can be achieved. FIG. 19 shows the vicinity of slide member 3 as being enlarged with second case member 22 being attached to first case member 21. Since first protrusion 4 has entered a part of slide track 2, slide member 3 is unable to move toward first protrusion 4. Consequently, slide member 3 is prevented from taking the third position. Since first protrusion 4 is always located in slide track 2 while a user uses electronic device 101, slide member 3 is never located at the third position. According to such a structure, slide member 3 is prevented from dropping off from slide track 2 during use by the user.

Electronic device 101 includes lid portion 32 attached to first case member 21 so as to close accommodation portion 10 while battery 1 is accommodated in accommodation portion 10 and slide member 3 may include a surface 3c (see FIGS. 9, 14, and 15) which abuts on lid portion 32. Slide member 3 includes flat surface 3c as an upper surface and surface 3c abuts on lid portion 32 when lid portion 32 is attached to first case member 21 (for example, a Z2 portion in FIG. 15).

When battery 1 momentarily attempts to move in a direction out of accommodation portion 10 due to an impact such as drop and force in a direction to lift extension portion 3a is applied, force is distributed and resistance to impact can be exhibited because surface 3c abuts on a lower surface of lid 32 over an area great to some extent. As shown in FIGS. 14 and 15, a side surface of slide member 3 on the right in the figure also abuts on the side surface of first case member 21 and force can similarly be distributed at the time of impact (for example, a Z3 portion in FIG. 15). A portion where the upper surface of hook portion 3b abuts on first case member 21 in FIG. 15 (for example, a Z4 portion in FIG. 15) can also similarly receive and distribute force, which is useful for slide member 3 to withstand the impact.

Figure 20:
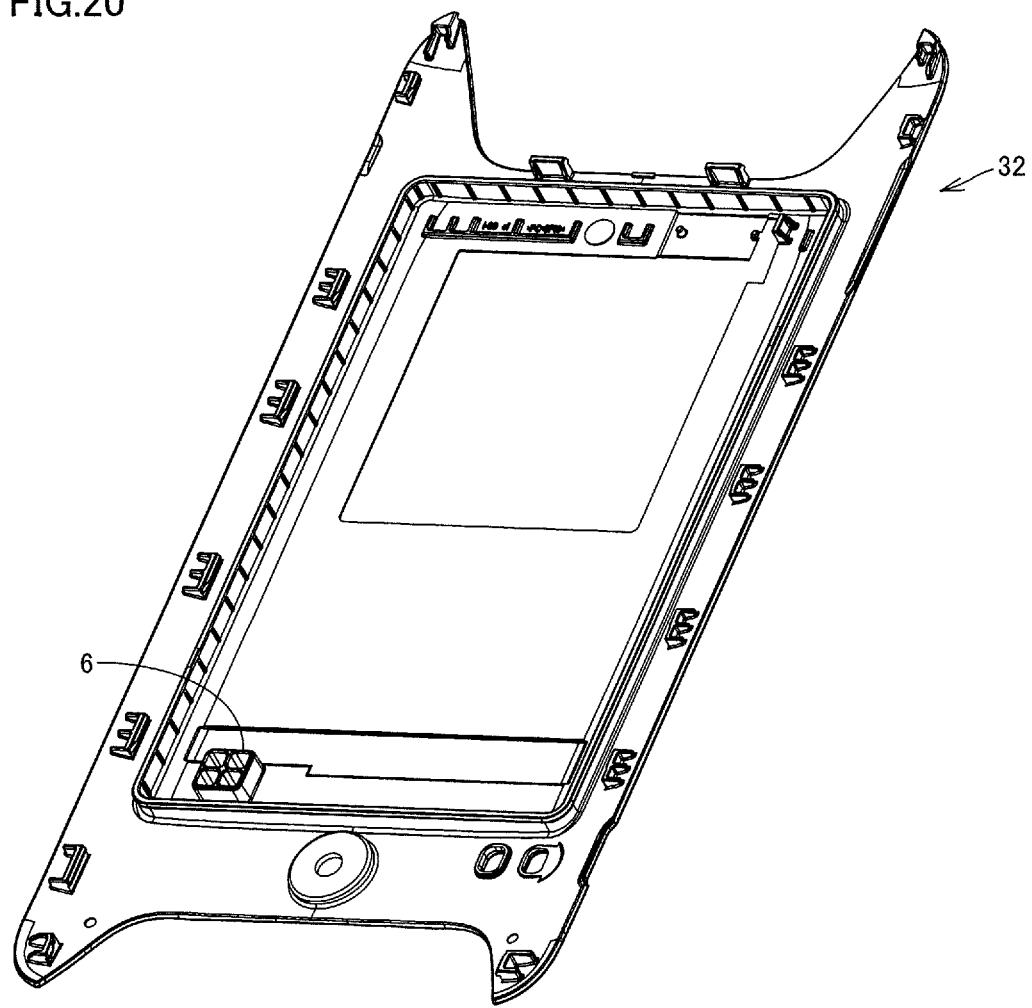
FIG. 20 is a first perspective view of a lid portion included in the electronic device in the first embodiment based on the present disclosure.
Figure 21:
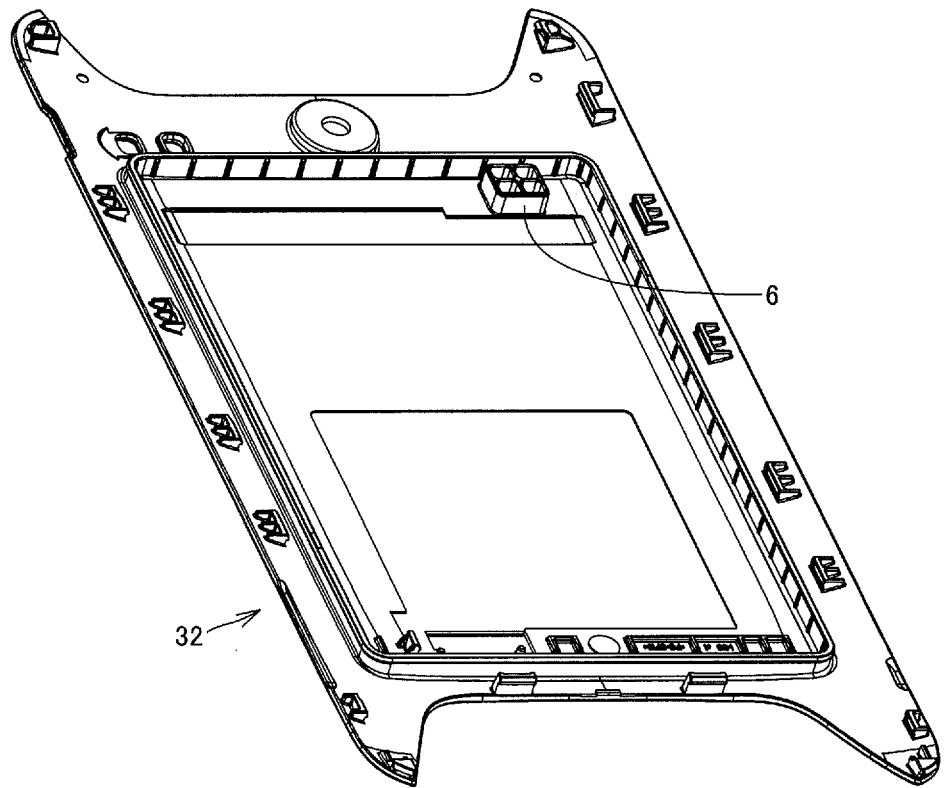
FIG. 21 is a second perspective view of the lid portion included in the electronic device in the first embodiment based on the present disclosure.
Figure 22:
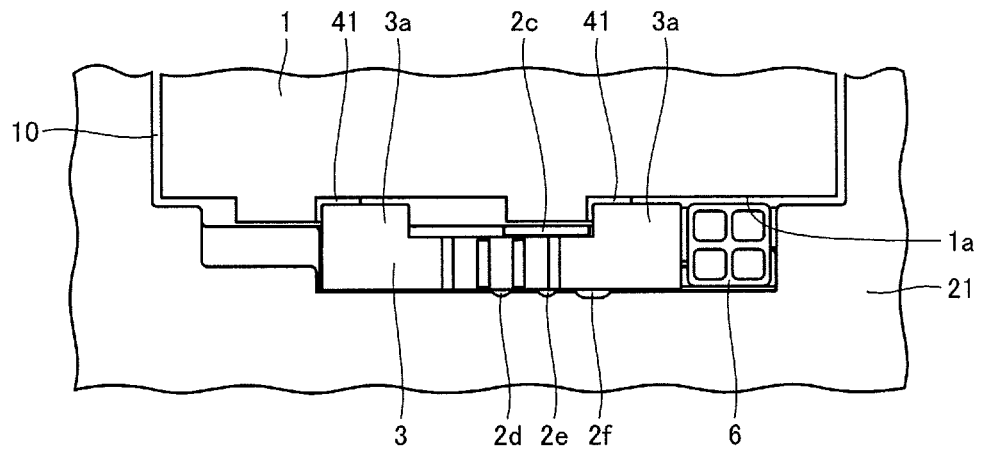
FIG. 22 is a perspective plan view showing positional relation between the slide member and a second protrusion located behind the lid portion in the electronic device in the first embodiment based on the present disclosure.

FIGS. 20 and 21 show lid portion 32 taken out alone. FIG. 21 shows lid portion 32 in a direction different from that in FIG. 20. Lid portion 32 includes a second protrusion 6. FIG. 22 shows positional relation between slide member 3 and second protrusion 6 in the plan view, with lid portion 32 being attached to first case member 21. Second protrusion 6 and slide member 3 located behind lid portion 32 are basically not seen as being covered with lid portion 32. FIG. 22, however, shows a state behind lid portion 32 as a perspective view. Lid portion 32 may be constructed to include second protrusion 6 inserted in the space in which slide member 3 slides, that is, slide track 2, while lid portion 32 is attached to first case member 21, and slide member 3 is prevented from taking the second position while second protrusion 6 is located in the space. In the example shown here, second protrusion 6 is structured to include 2×2 quadrangular openings. For reduction in weight, second protrusion 6 may be some kind of a hollow structure. Second protrusion 6 may be in a form of a simple quadrangular hollow prism similarly to first protrusion 4 (see FIG. 18). When an area occupied by second protrusion 6 is great in the plan view, second protrusion 6 may be strengthened by providing a partition in a hollow portion therein as in the example shown in FIG. 22. In the example shown in FIGS. 20 to 22, a "+" shaped partition is located in the hollow portion of second protrusion 6.

A plurality of additional features described in an embodiment above may be adopted as being combined as appropriate.

Though description has been given so far by using the term "electronic device," the electronic device is a broad concept covering, for example, a portable telephone, a portable information terminal, a tablet terminal, a personal computer, a game console, a television receiver, a portable music player, a CD player, a DVD player, an electronic dictionary, an electronic book reader, a digital camera, a video camera, a radio receiver, and a navigation system. The concept of the portable telephone or the portable information terminal includes a smartphone.

An embodiment disclosed herein is illustrative and non-restrictive in every respect. The scope of the present disclosure is defined by the terms of the claims and is intended to include any modifications within the scope and meaning equivalent to the terms of the claims.

The invention claimed is:

1. An electronic device comprising:
    a battery including a first end portion in a plan view, the first end portion including a first engagement portion;
    a first case member including an accommodation portion where the battery is accommodated;
    a slide member which is held by the first case member and is slidable along the first end portion, the slide member including a first structure which prevents the slide member from dropping off from the first case member, and
    the slide member being able to take a first position at which the slide member is in engagement with the first engagement portion and a second position at which the slide member is not in engagement with the first engagement portion as a result of sliding along the first end portion, wherein the slide member can take a third position which is different from the first position and the second position at which the slide member is attachable to and removable from the first case member as a result of sliding along the first end portion; and
    a second case member attached to the first case member, wherein the second case member includes a first protrusion inserted in a space in which the slide member slides while the second case member is attached to the first case member and the slide member is prevented from taking the third position while the first protrusion is inserted in the space.

2. The electronic device according to claim 1, wherein the slide member includes an extension portion which restrains the first engagement portion so as to prevent the battery from coming out of the accommodation portion when the slide member is located at the first position.

3. The electronic device according to claim 1, wherein the first structure includes a hook portion hooked to the first case member.

4. The electronic device according to claim 1, wherein the battery includes a second end portion opposite to the first end portion, the second end portion includes a second engagement portion, the first case member includes a third engagement portion which is engaged with the second engagement portion, and the battery is introducible in and removable from the accommodation portion as being pivoted around a portion where the second engagement portion and the third engagement portion are in contact with each other while the slide member is located at the second position.

5. The electronic device according to claim 1, the electronic device comprising a lid portion attached to the first case member so as to close the accommodation portion while the battery is accommodated in the accommodation portion, wherein the slide member includes a surface which abuts on the lid portion.

6. The electronic device according to claim 5, wherein the lid portion includes a second protrusion inserted in a space in which the slide member slides while the lid portion is attached to the first case member, and the slide member is prevented from taking the second position while the second protrusion is inserted in the space.

* * * * *